United States Patent
Kernwein et al.

(10) Patent No.: US 9,294,102 B2
(45) Date of Patent: Mar. 22, 2016

(54) METHOD FOR ADJUSTING AN EXCITATION FREQUENCY OF AN OSCILLATING CIRCUIT OF A CORONA IGNITION DEVICE

(71) Applicant: BorgWarner Ludwigsburg GmbH, Ludwigsburg (DE)

(72) Inventors: Markus Kernwein, Bretten (DE); Torsten Schremmer, Ludwigsburg (DE)

(73) Assignee: BorgWarner Ludwigsburg GmbH, Ludwigsburg (DE)

( * ) Notice: Subject to any disclaimer, the term of this patent is extended or adjusted under 35 U.S.C. 154(b) by 0 days.

(21) Appl. No.: 14/506,792

(22) Filed: Oct. 6, 2014

(65) Prior Publication Data

US 2015/0097626 A1    Apr. 9, 2015

(30) Foreign Application Priority Data

Oct. 7, 2013 (DE) .......................... 10 2013 111 062

(51) Int. Cl.
| | |
|---|---|
| *H01T 19/00* | (2006.01) |
| *F02P 3/01* | (2006.01) |
| *H03B 5/08* | (2006.01) |
| *H03L 7/00* | (2006.01) |
| *F02P 23/04* | (2006.01) |

(Continued)

(52) U.S. Cl.
CPC ........ *H03L 7/00* (2013.01); *F02D 41/28* (2013.01); *F02P 3/01* (2013.01); *F02P 3/0442* (2013.01);
(Continued)

(58) Field of Classification Search
CPC ............... F02P 3/005; F02P 3/01; F02P 3/02; F02P 3/04; F02P 3/0407; F02P 3/05; F02P 3/06; F02P 3/08; F02P 3/0807; F02P 3/09; F02P 23/04; F02P 23/045; H01T 19/00; H01T 19/02; H01T 19/04; H03B 5/08; H03B 5/12; H03L 7/00; H03L 7/08
USPC ............. 123/143 B, 598, 606, 607, 618, 619; 331/14, 44, 111, 117 FE, 117 R, 143, 331/167; 361/253, 263
See application file for complete search history.

(56) References Cited

U.S. PATENT DOCUMENTS 5,565,819 A * 10/1996 Cooper ................ H03K 3/0231
331/111
5,670,915 A * 9/1997 Cooper ................ H03K 3/0231
331/111

(Continued)

FOREIGN PATENT DOCUMENTS

| | | |
|---|---|---|
| DE | 10 2011 052 096 A1 | 3/2012 |
| EP | 2 012 004 A1 | 1/2009 |
| WO | WO 2010/011838 A1 | 1/2010 |

*Primary Examiner* — Levi Gannon
(74) *Attorney, Agent, or Firm* — Bose McKinney & Evans LLP

(57) ABSTRACT

A method for setting adjusting frequency of an electric oscillating circuit of a corona ignition device. The circuit is excited with a starting value (f1) of the excitation frequency and a reference value ($I_R$) of a frequency-dependent variable is measured. The excitation frequency is incrementally changed. After every increment a value (I) of the frequency-dependent variable is measured and it is determined whether the measured value (I) deviates significantly from the reference value ($I_R$). Depending upon the measured value (I) relative to the reference value, the value (f) of the excitation frequency is either set as the new starting value (f1) or stored as a boundary value. Further incremental changes to the excitation frequency are made in one of two directions and further comparisons of the values I and $I_R$ are performed. Ultimately, the excitation frequency can be set to a mean value between first and second boundary values.

10 Claims, 3 Drawing Sheets

(51) Int. Cl.
*H01T 13/50* (2006.01)
*H01T 19/02* (2006.01)
*F02D 41/28* (2006.01)
*F02P 3/04* (2006.01)
*F02P 9/00* (2006.01)
*F02P 17/12* (2006.01)

(52) U.S. Cl.
CPC .............. *F02P 9/007* (2013.01); *F02P 17/12* (2013.01); *F02P 23/04* (2013.01); *H01T 13/50* (2013.01); *H01T 19/00* (2013.01); *H01T 19/02* (2013.01); *H03B 5/08* (2013.01); *F02D 2041/288* (2013.01)

(56) References Cited

U.S. PATENT DOCUMENTS

| | | | | |
|---|---|---|---|---|
| 7,847,648 | B2* | 12/2010 | Hu | H03K 3/011 331/143 |
| 8,669,817 | B2* | 3/2014 | Pancholi | H03K 4/502 331/14 |
| 2012/0055455 | A1 | 3/2012 | Ruan et al. | |
| 2012/0249163 | A1* | 10/2012 | Burrows | F02P 23/04 324/633 |
| 2014/0226252 | A1 | 8/2014 | Freen | |

* cited by examiner

METHOD FOR ADJUSTING AN EXCITATION FREQUENCY OF AN OSCILLATING CIRCUIT OF A CORONA IGNITION DEVICE

RELATED APPLICATIONS

This application claims priority to DE 10 2013 111 062.2, filed Oct. 7, 2013, which is hereby incorporated herein by reference in its entirety.

BACKGROUND

The invention relates to a method for adjusting an excitation frequency of an oscillating circuit of a corona ignition device.

Document WO 2010/011838 A1 discloses a corona ignition device with which a fuel/air mixture can be ignited in a combustion chamber of an internal combustion engine by a corona discharge created in the combustion chamber. This corona ignition device comprises an ignition electrode, which is inserted in an insulator. The ignition electrode, the insulator and a sleeve enclosing the insulator form an electrical capacitance. This capacitance is part of an electric oscillating circuit of the corona ignition device, which is excited with a high-frequency alternating voltage of 30 kHz to 50 MHz, for example. The result is a voltage step-up at the ignition electrode, which results in the formation of a corona discharge at said ignition electrode.

In order to ensure efficient operation, it is important that the excitation frequency of the oscillating circuit be as close to the resonant frequency thereof as possible.

Document WO 2010/011838 A1 discloses that the frequency of the oscillating circuit is regulated by measuring the phase shift between current and voltage at the feed points of the oscillating circuit and regulating said phase shift to the value zero by means of a phase-locked loop. In a series oscillating circuit, current and voltage are in phase (phase shift=zero) in the resonant state. The phase-locked loop controls the switching rate of a switching device, by means of which a predefined voltage is applied, in alternation, to one primary winding and to the other primary winding of the transformer. Thus current and voltage are in phase with one another on the secondary side of the transformer, at the feed points of the series oscillating circuit.

In prior art systems and methods, the shift of the resonant frequency of the HF oscillating circuit, which contains the HF ignition device, is a major problem. Different causes are involved here. One cause of the shift of the resonant frequency involves changes in temperature, humidity, contamination of the tip or tips of the ignition electrode of the HF ignition device, and changes in parameters related to the operation of the internal combustion engine. Adjusting the excitation frequency to the resonant frequency by means of a phase-locked loop, as is disclosed in WO 2010/011838 A1, is complex, however, and only partially solves the problem. The reason therefor is that the phase control is susceptible to a temperature drift of the components of the phase-locked loop and to voltage noise.

In order to avoid the disadvantages of a phase-locked loop, it is known from DE 10 2011 052 096 A1 to monitor the instantaneous values of current or voltage of the oscillating circuit and feed the high-frequency generator with primary voltage pulses that are initiated or terminated when the instantaneous value of current or voltage falls below or exceeds, respectively, a predefined switching threshold. This method has the disadvantage of being highly complex in terms of measurement technology.

SUMMARY

This disclosure teaches a way of operating a corona ignition device in a relatively simple manner close to the resonant frequency thereof.

There are several electrical variables of the oscillating circuit of a corona ignition device that change when the excitation frequency approaches the resonant frequency. Such variables are referred to in the following as frequency-dependent variables. Examples of such variables are the phase between current and voltage, the impedance, or the quotient of current and voltage.

Some of these variables have a zero crossing when the excitation frequency coincides with the resonant frequency. Such variables have different algebraic signs at excitation frequencies above and below the resonant frequency. One example thereof is the phase between current and voltage. Other frequency-dependent variables have extremal values when the excitation frequency coincides with the resonant frequency. If the value of the variable is plotted as a function of the excitation frequency, a maximum or a minimum then occurs at the resonant frequency. The impedance is minimal, for example, when the excitation frequency coincides with the resonant frequency. The quotient of current and voltage is at a maximum when the excitation frequency coincides with the resonant frequency. At a constant voltage, the current is at a maximum when the excitation frequency coincides with the resonant frequency.

A feature common to all frequency-dependent variables is that, in the event that the frequency changes, the present value of the variable can be compared to the previous value of the variable in order to determine whether the frequency change resulted in the excitation frequency approaching the resonant frequency or not. However, the change in the value of a frequency-dependent variable resulting from a change in frequency can be so small that, due to unavoidable measurement errors, it cannot be determined whether the excitation frequency was closer to the resonant frequency before or after the frequency changed. This applies, in particular, when the frequency-dependent variable changes only slightly in the vicinity of the resonant frequency, for example, has a flat maximum or minimum.

In a comparison of two values of a frequency-dependent variable that are measured at different excitation frequencies, the value having an excitation frequency that is closer to the resonant frequency is referred to in the following as "better". If the frequency-dependent variable has a zero crossing at the resonant frequency, such as, for example, the phase between current and voltage, the smaller absolute value is "better". If the frequency-dependent variable is at a minimum at the resonant frequency, such as the impedance, for example, the smaller value is therefore "better". If the frequency-dependent variable is at a maximum at the resonant frequency, such as the quotient of current and voltage, for example, the larger value is therefore "better". Similarly, in a comparison of two values of a frequency-dependent variable, the value having an excitation frequency further away from the resonant frequency is considered to be "worse."

In a method according to this disclosure, the oscillating circuit of the corona ignition device is initially excited with an excitation frequency having a value that is referred to as the starting value, for simplicity. A value of a frequency-dependent variable is measured and this value, which belongs to the starting value of the excitation frequency, is stored as a reference value. Next, the excitation frequency is incrementally changed in a first direction (either increased or decreased) and a value of the frequency-dependent variable is re-determined after every increment. This value is then compared to the reference value in each case. If a significant improvement is found, this value is used as the reference value in the following and the value of the excitation frequency belonging thereto is used as the starting value.

If the excitation frequency was increased in the incremental change, a starting value of the excitation frequency is obtained that does not improve significantly in further incremental increases. In contrast, in further incremental increases, one ultimately obtains a value of the frequency-dependent variable that is significantly worse. The excitation frequency associated with this value is stored as the first boundary value in a method according to this disclosure.

Instead of incrementally increasing the excitation frequency, it is also possible to decrease the excitation frequency. If the excitation frequency was decreased in the incremental change, a starting value of the excitation frequency is ultimately obtained that does not improve significantly in further incremental decreases. In contrast, in further incremental decreases, one ultimately obtains a value of the frequency-dependent variable that is significantly worse. The excitation frequency associated with this value is then stored as the first boundary value.

In this context, the word "significantly" means that the difference between the reference value and the value measured at a changed frequency exceeds a predefined threshold value. The threshold value is selected such that said threshold value is greater than the measurement inaccuracy.

If the first boundary value has been found, then, proceeding from the starting value, the excitation frequency is incrementally changed in the other direction, i.e., is decreased, if the first boundary value was found by incrementally increasing the excitation frequency, whereas the excitation frequency is increased if the first boundary value was found by incrementally decreasing the excitation frequency. This other direction of the frequency change is also referred to in the following as the second direction.

After every increment, a value of the frequency-dependent variable of the oscillating circuit is measured and a check is carried out to determine whether the measured value deviates significantly from the reference value, that is, whether the measured value of the frequency-dependent variable deviates from the reference value by more than a predefined threshold value. If the measured value of the frequency-dependent variable is significantly better than the reference value, the present value of the excitation frequency is chosen to be the new starting value and, proceeding from the new starting value, the excitation frequency is changed further in the second direction. If the new starting value was found by increasing the frequency, the increase is continued. If the new starting value was found by decreasing the frequency, the decrease is continued.

In this manner one ultimately finds a starting value of the excitation frequency that can no longer be significantly improved by further incremental frequency changes. Further incremental frequency changes in the second direction ultimately lead to a value of the frequency-dependent variable that is significantly worse than the reference value. The present value of the excitation frequency, i.e., the value of the excitation frequency associated with this value of the frequency-dependent value, is then stored as the second boundary value.

The excitation frequency is then set at a mean value of the two boundary values. This mean value is, in general, closer to the resonant frequency than the previously determined starting value.

If the method is subsequently carried out once more, the mean value of the two boundary values is used as the starting value, whereby the boundary values are re-determined. Therefore, the starting value of the excitation frequency is always the best known value, i.e., the value that best coincides with the resonant frequency, based on the most up-to-date findings. The starting value used to start the method is often relatively poor the first time the excitation frequency is set after an engine is started, and therefore better values can be found in the incremental changing of the excitation frequency. If the method is then carried out in subsequent engine cycles in order to adjust the excitation frequency to a changed resonant frequency, an incremental frequency change often does not result in a significant improvement of the starting value, thereby enabling the method to be carried out with fewer steps and, therefore, more quickly.

A method according to this disclosure can be carried out in entirety in a single engine cycle. Since the resonant frequency typically changes slowly over a plurality of engine cycles, the method can also be carried out over a plurality of engine cycles, for example, by determining only the first boundary value in a first engine cycle and then determining the second boundary value in a second engine cycle. Preferably, the increment of the frequency change is selected to be so large that the method can be carried out in entirety in a single engine cycle.

The excitation frequency can be changed in increments, for example, having a width between 0.01% and 5% of the starting value. Preferably, the excitation frequency is changed in increments having a width between 0.02% and 0.2% of the starting value.

According to an advantageous refinement of this disclosure, the frequency-dependent variable is measured while a stable corona discharge is maintained. The resonant frequency changes only slightly when a corona discharge is initiated. The excitation frequency can be set to the resonant frequency with greater accuracy by measuring the frequency-dependent variable during stable only while the corona discharge is maintained.

The method according to this disclosure can be carried out by a control unit of a corona ignition device in every engine cycle. The resonant frequency usually only shifts relatively slowly over a relatively large number of engine cycles, for example, due to a temperature change of the oscillating circuit. It is therefore not necessary to carry out the method adjusting setting the excitation frequency in every engine cycle. For example, the control unit of the corona ignition device can contain a counter, which counts the number of completed ignitions, and carries out the method after a defined number of ignitions, for example, in every tenth or every hundredth engine cycle. As an alternative or in addition, the method can also be triggered by special values of engine operating parameters or changes of engine operating parameters.

The invention also relates to a corona ignition device comprising a control unit, which is configured to carry out a method according to this disclosure. The control unit can comprise a memory, for example, in which a program is stored, wherein said program allows the control unit to carry out a method according to this disclosure when the program is carried out by the control unit.

BRIEF DESCRIPTION OF THE DRAWINGS

The above-mentioned aspects of exemplary embodiments will become more apparent and will be better understood by reference to the following description of the embodiments taken in conjunction with the accompanying drawings, wherein.

DESCRIPTION

The embodiments described below are not intended to be exhaustive or to limit the invention to the precise forms disclosed in the following detailed description. Rather, the embodiments are chosen and described so that others skilled in the art may appreciate and understand the principles and practices of this disclosure.

Figure 1:
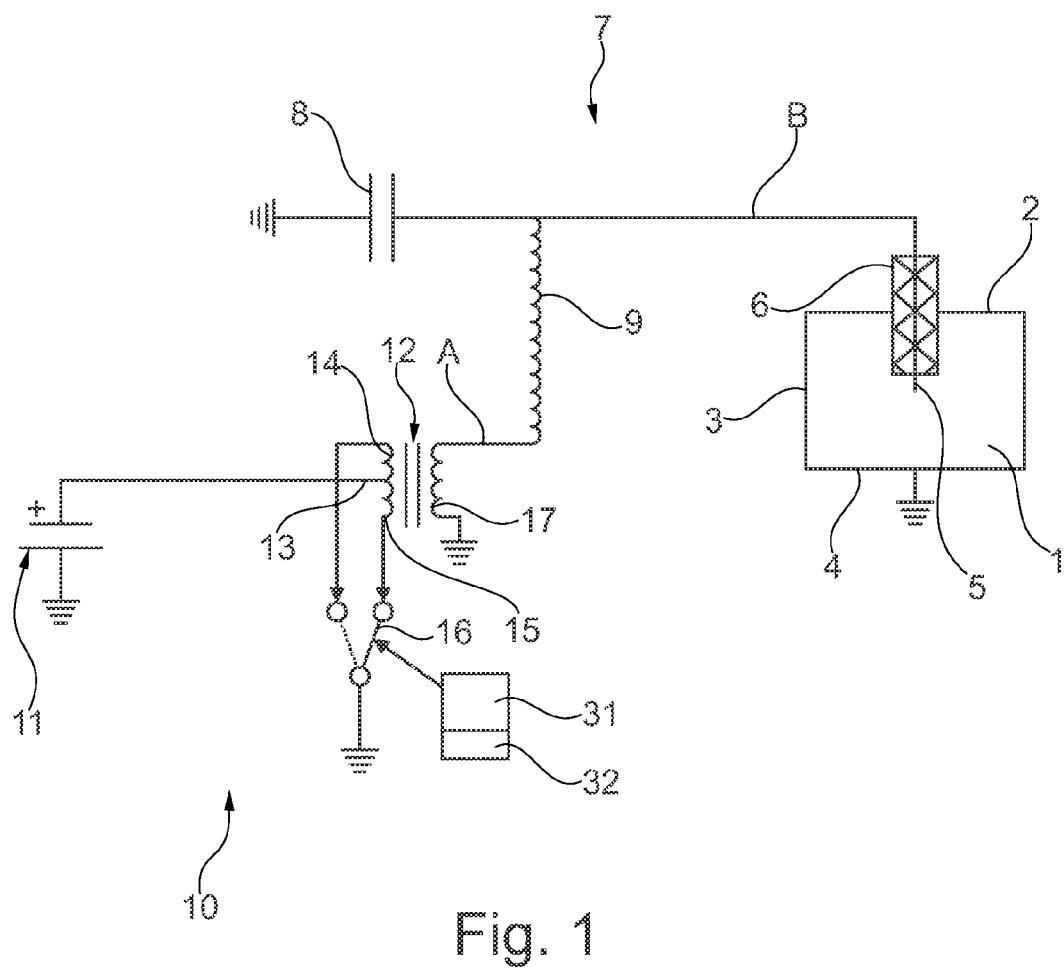
FIG. 1 shows a schematic depiction of an example of a corona ignition device.

FIG. 1 shows a combustion chamber 1, which is delimited by walls 2, 3, and 4, which are at ground potential. An ignition electrode 5, which is enclosed by an insulator 6 along a portion of the length thereof, extends into the combustion chamber 1 from above, and extends through the upper wall 2 into the combustion chamber 1 in an electrically insulated manner by way of said insulator. The ignition electrode 5 and the walls 2 to 4 of the combustion chamber 1 are part of a series oscillating circuit 7, which also includes a capacitor 8 and an inductor 9. Of course, the series oscillating circuit 7 can also comprise further inductors and/or capacitors, and other components that are known to a person skilled in the art as possible components of series oscillating circuits.

A high-frequency generator 10 is provided for the excitation of oscillating circuit 7, and comprises a DC voltage source 11 and a transformer 12 having a center tap 13 on the primary side thereof, thereby enabling two primary windings 14 and 15 to meet at the center tap 13. Using a high-frequency switch 16, the ends of the primary windings 14 and 15 furthest from the center tap 13 are connected to ground in alternation. The switching rate of the high-frequency switch 16 determines the frequency with which the series oscillating circuit 7 is excited, and can be changed. The secondary winding 17 of the transformer 12 supplies the series oscillating circuit 7 at the point A. The high-frequency switch 16 is controlled by a control unit 31. The control unit 31 thereby specifies the frequency of the alternating voltage, which is generated by the high-frequency generator as secondary voltage, and by means of which the oscillating circuit 7 is excited.

Such an oscillating circuit 7 comprising an ignition electrode 5 is provided for each combustion chamber of an engine. A high-frequency generator 10 can supply a plurality of oscillating circuits 7. It is also possible, however, for each oscillating circuit to be connected to a separate high-frequency generator 10. A single control unit 31 suffices in both cases.

The combustion chamber 1 is limited by an upper wall 2 in the form of a cylinder head, a cylindrical circumferential wall 3, and the top side 4 of a piston, which is equipped with piston rings and can move back and forth in the cylinder.

The cylinder head 2 comprises a passage through which the ignition electrode 5 is guided in an electrically insulated and sealed manner. The ignition electrode 5 is enclosed along a portion of the length thereof by an insulator 6, which can be composed of a sintered ceramic, e.g., an aluminium oxide ceramic. The ignition electrode 5 extends via the tip thereof into combustion chamber 1 and extends slightly past insulator 6, although it could also be flush therewith.

When the oscillating circuit 7 is excited, a corona discharge forms primarily in the region surrounding the ignition electrode 5, and can be accompanied by a more or less intensive charge carrier cloud.

In order to set the excitation frequency of the oscillating circuit 7 to a value that is as close as possible to the resonant frequency thereof, and to adapt the excitation frequency to changes in the resonant frequency, the control unit 31 initially excites the oscillating circuit at a starting value of the excitation frequency and measures a frequency-dependent variable of the oscillating circuit, for example, the impedance or the quotient of current and voltage. This quotient is referred to as standardized current.

Figure 2:
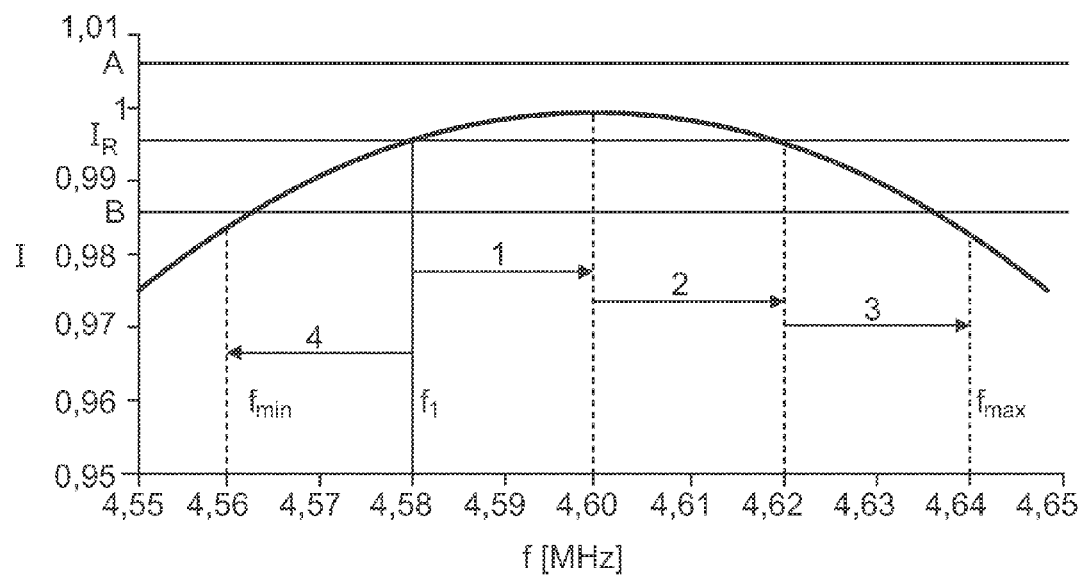
FIG. 2 shows an example of the quotient of current and voltage as a function of the excitation frequency, and the steps carried out to set the excitation frequency.

In FIG. 2, the standardized current I is plotted in arbitrary units as a function of the excitation frequency f. The standardized current I has a maximum at the resonant frequency, which has a value of 4.60 MHz in the example shown. In reality, the resonant frequency of the oscillating circuit 7 is known only with a certain amount of uncertainty, since said resonant frequency is subject to temperature-dependent fluctuations and noise.

The best known value of the resonant frequency is used as the starting value of the excitation frequency. This starting value is typically close to the resonant frequency, while deviating slightly therefrom. In FIG. 1, a value f1=4.58 MHz is given as an example of the starting value. The control unit 31 therefore excites the oscillating circuit 7 with the excitation frequency f1 and measures the standardized current I that occurs. This value is stored as reference value $I_R$.

Proceeding from the starting value f1, the control unit 31 then incrementally changes the excitation frequency and measures the standardized current I after every increment. Three increasing steps 1, 2 and 3 are indicated in FIG. 2 as examples. The value of the standardized current I measured after every increment is compared with the reference value $I_R$. A check is conducted to determine whether the measured value deviates significantly from the reference value $I_R$. A significant deviation exists when the deviation exceeds a predefined threshold value. This is the case when the measured value is outside the band delimited by the values A and B in FIG. 2.

In the example depicted in FIG. 2, the first two steps 1 and 2 do not result in a significant change in the standardized current I. The standardized current I does not change until after the third step. After the third step, the standardized current is significantly less than the reference value $I_R$. Since the standardized current has a maximum at the resonant frequency, this value is "worse" than the reference value. After the third step, the excitation frequency is therefore further away from the resonant frequency than the starting value f1 of the excitation frequency. The value of the excitation frequency after the third step is stored as the first boundary value. This first boundary value is labelled fmax in FIG. 2.

When the excitation frequency is incrementally changed and a significantly poorer value of the frequency-dependent variables, namely of the standardized current in the example depicted in FIG. 2, is found and a first boundary value was determined, the excitation frequency is changed, proceeding from the starting value, in a second direction, i.e., is reduced in the example depicted in FIG. 2.

In FIG. 2, a reduction in the excitation frequency is therefore indicated as step 4. After step 4, a value of the standardized current I was measured that is significantly worse than the reference value $I_R$, is located below the value B. The value of the excitation frequency after the fourth step is therefore stored as the second boundary value. The second boundary value is indicated as fmin in FIG. 2.

The control unit 31 then calculates a value for the resonant frequency fr as the mean value of the two boundary values fmin and fmax at fr=(fmin+fmax)/2 and then sets the excitation frequency to this value fr.

A program for carrying out the method described for setting the excitation frequency is stored in a memory 32 of the control unit 31.

Figure 3:
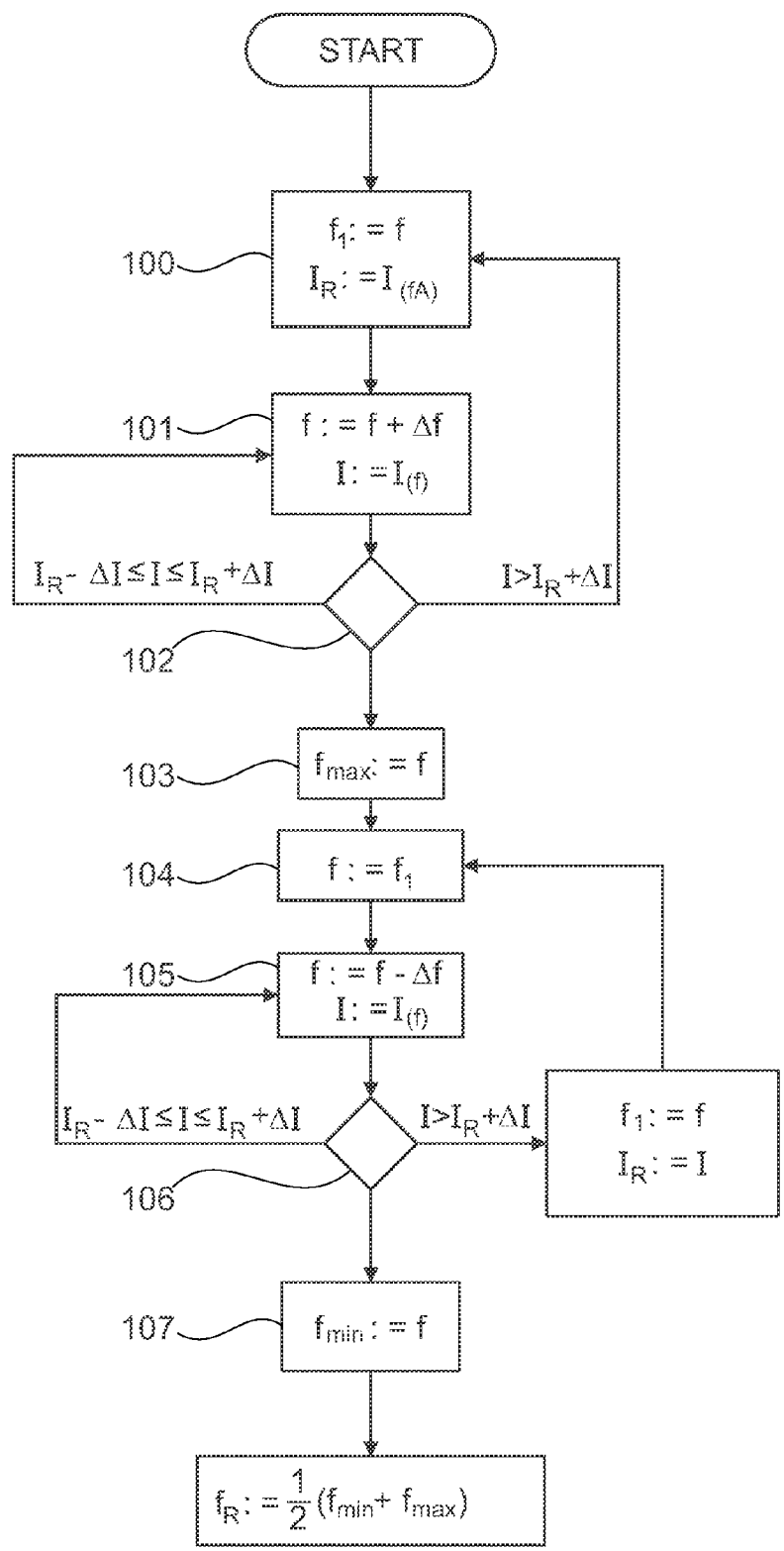
FIG. 3 shows a flow chart of a method for adjusting an excitation frequency of an electric oscillating circuit of a corona ignition device.

A flow chart of an embodiment of the method is shown in FIG. 3. In step 100, the present value f of the excitation frequency is stored as the starting value f1 and the value of the frequency-dependent variable 1 measured at this excitation frequency is stored as reference value $I_R$.

In the example depicted in FIG. 3, in the next step 101, the present value f of the excitation frequency is increased by a predefined amount $\Delta f$. The method can be modified such that, in step 101, the present value f of the excitation frequency is instead reduced by a predefined amount $\Delta f$. The present value I of the frequency-dependent variable for the changed value of the excitation frequency is determined in step 101.

In step 102, the present value of the frequency-dependent variable is compared with the reference value $I_R$. If the present value I does not differ significantly from the reference value, at the most deviating from the reference value by a threshold value $\Delta I$, step 101 is repeated. If the present value I is significantly better than the reference value, step 100 is repeated. If the present value I is significantly worse than the reference value, the current frequency is stored as the boundary value fmax in step 103.

In the embodiment depicted in FIG. 3, the frequency-dependent variable of the oscillating circuit is a variable that is at a maximum at the resonant frequency. Hence, the present value I is significantly better than the reference value if the present value exceeds the reference value by more than the threshold value, and the present value I is significantly worse than the reference value when the present value falls below the reference value by more than the threshold value. If a frequency-dependent variable that is at a minimum at the resonant frequency is used for the method, the process returns to step 100 if the present value falls below the reference value by more than the threshold value, and returns to step 103 if the present value exceeds the reference value by more than the threshold value.

In step 104, the present value f of the excitation frequency is reset to the starting value f1. In step 105, the present value f is then reduced by the predefined amount $\Delta f$ and, next, the present value I of the frequency-dependent variable is determined. The method can be modified such that steps 101 and 105 are interchanged.

In step 106, the present value I of the frequency-dependent variable is compared with the reference value $I_R$. If the present value I does not differ significantly from the reference value, at the most deviating from the reference value by less than a threshold value $\Delta I$, step 105 is repeated. If the present value I is significantly better than the reference value, the value fmax determined in step 103 is updated to the starting value f1, the current frequency value f is stored as the starting value f1, and the present value of the frequency-dependent value is stored as the reference value. Step 104 is then repeated using these values. If the present value I is significantly worse than the reference value in step 106, the current frequency is stored as the boundary value fmin in step 107.

In step 108, the resonant frequency is then calculated as the mean value of the two boundary values. If the method is repeated, the thusly calculated resonant frequency can be used as the starting value f1.

While exemplary embodiments have been disclosed hereinabove, the present invention is not limited to the disclosed embodiments. Instead, this application is intended to cover any variations, uses, or adaptations of this disclosure using its general principles. Further, this application is intended to cover such departures from the present disclosure as come within known or customary practice in the art to which this invention pertains and which fall within the limits of the appended claims.

What is claimed is:

1. A method for adjusting an excitation frequency of an electric oscillating circuit of a corona ignition device, comprising:
    exciting the oscillating circuit with a starting value of the excitation frequency, measuring a value of a frequency-dependent variable of the oscillating circuit and storing the measured value as a reference value;
    incrementally increasing the excitation frequency proceeding from the starting value;
    after every increment, measuring a value of the frequency-dependent variable of the oscillating circuit and performing a check to determine whether the measured value of the frequency-dependent variable deviates from the reference value by more than a predefined threshold value, wherein:
    if the measured value of the frequency-dependent variable deviates from the reference value by more than the threshold value and the measured value of the frequency-dependent variable is better than the reference value, the measured value is stored as the new reference value and the value of the excitation frequency associated with the measured value of the frequency-dependent variable is chosen to be the new starting value and, proceeding from the new starting value, the excitation frequency is incrementally increased;
    if the measured value of the frequency-dependent variable deviates from the reference value by more than the threshold value and is worse than the reference value, the value of the excitation frequency associated with this measured value of the frequency-dependent variable is stored as a first boundary value and, proceeding from the starting value, the excitation frequency is incrementally decreased;
    if, after decreasing the excitation frequency, a value of the frequency-dependent variable is measured that deviates from the reference value by more than the predefined threshold value and is better than the reference value, the measured value is stored as the new reference value and the value of the excitation frequency associated with the measured value of the frequency-dependent variable is chosen to be the new starting value and, proceeding from the new starting value, the excitation frequency is incrementally decreased;
    if, after decreasing the excitation frequency, a value of the frequency-dependent variable is measured that deviates from the reference value by more than the predefined threshold value and is worse than the reference value, the value of the excitation frequency associated with this measured value of the frequency-dependent variable is stored as a second boundary value;
    wherein the excitation frequency is then set to a mean value between the first boundary value and the second boundary value.

2. A method for adjusting an excitation frequency of an oscillating circuit of a corona ignition device, comprising:
    exciting the oscillating circuit with a starting value of the excitation frequency, measuring a value of a frequency-dependent variable of the oscillating circuit and storing the measured value as a reference value;

wherein, the excitation frequency is incrementally decreased proceeding from the starting value;

after every increment, a value of the frequency-dependent variable of the oscillating circuit is measured and a check is performed to determine whether the measured value of the frequency-dependent variable deviates from the reference value by more than a predefined threshold value, wherein, if the measured value of the frequency-dependent variable deviates from the reference value by more than the threshold value and the measured value of the frequency-dependent variable is better than the reference value, the measured value is stored as the new reference value and the value of the excitation frequency associated with the measured value of the frequency-dependent variable is chosen to be the new starting value and, proceeding from the new starting value, the excitation frequency is incrementally decreased;

if the measured value of the frequency-dependent variable deviates from the reference value by more than the threshold value and is worse than the reference value, the value of the excitation frequency associated with this measured value of the frequency-dependent variable is stored as a first boundary value and, proceeding from the starting value, the excitation frequency is incrementally increased;

if, after increasing the excitation frequency, a value of the frequency-dependent variable is measured that deviates from the reference value by more than the predefined threshold value and is better than the reference value, the measured value is stored as the new reference value and the value of the excitation frequency associated with the measured value of the frequency-dependent variable is chosen to be the new starting value and, proceeding from the new starting value, the excitation frequency is incrementally increased;

if, after increasing the excitation frequency, a value of the frequency-dependent variable is measured that deviates from the reference value by more than the predefined threshold value and is worse than the reference value, the value of the excitation frequency associated with this measured value of the frequency-dependent variable is stored as a second boundary value;

wherein the excitation frequency is then set to a mean value between the first boundary value and the second boundary value.

3. The method according to claim 1, wherein the size of the increments is constant.

4. The method according to claim 1, wherein the size of the increments is between 0.01 and 1% of the starting value.

5. The method according to claim 1, wherein a variable is used as the frequency-dependent variable that has an extremal value when the excitation frequency coincides with the resonant frequency.

6. The method according to claim 1, wherein a variable is used as the frequency-dependent variable that has a zero crossing when the excitation frequency coincides with the resonant frequency.

7. The method according to claim 1, wherein the frequency-dependent variable is measured while a stable corona discharge is maintained.

8. The method according to claim 1, wherein, after the excitation frequency is changed, a predefined waiting period ensues before a measurement of the frequency-dependent variable is started.

9. A corona ignition device for igniting fuel in a combustion chamber of a cyclically operating internal combustion engine, comprising:

an oscillating circuit, which has an ignition electrode;

a high-frequency generator configured for generating an alternating voltage from a primary voltage for exciting the oscillating circuit; and a control unit configured for controlling the high-frequency generator, wherein the control unit is configured to carry out a method according to claim 1.

10. A corona ignition device for igniting fuel in a combustion chamber of a cyclically operating internal combustion engine, comprising:

an oscillating circuit, which has an ignition electrode;

a high-frequency generator configured for generating an alternating voltage from a primary voltage for exciting the oscillating circuit; and a control unit configured for controlling the high-frequency generator, wherein the control unit is configured to carry out a method according to claim 2.

* * * * *